United States Patent
Chu et al.

(10) Patent No.: US 10,486,964 B2
(45) Date of Patent: Nov. 26, 2019

(54) METHOD FOR FORMING A MICRO-ELECTRO MECHANICAL SYSTEM (MEMS) INCLUDING BONDING A MEMS SUBSTRATE TO A CMOS SUBSTRATE VIA A BLOCKING LAYER

(71) Applicant: TAIWAN SEMICONDUCTOR MANUFACTURING CO., LTD., Hsinchu (TW)

(72) Inventors: Chia-Hua Chu, Zhubei (TW); Chun-Wen Cheng, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 17 days.

(21) Appl. No.: 15/472,431

(22) Filed: Mar. 29, 2017

(65) Prior Publication Data
US 2017/0197821 A1  Jul. 13, 2017

Related U.S. Application Data

(62) Division of application No. 14/049,988, filed on Oct. 9, 2013, now Pat. No. 9,617,150.

(51) Int. Cl.
*B81C 1/00* (2006.01)
*B81B 7/00* (2006.01)

(52) U.S. Cl.
CPC ........ *B81C 1/00238* (2013.01); *B81B 7/0035* (2013.01); *B81B 7/0041* (2013.01); *B81C 1/00277* (2013.01); *B81C 1/00301* (2013.01); *B81C 1/00793* (2013.01); *B81C 2201/013* (2013.01); *B81C 2201/053* (2013.01); *B81C 2203/0118* (2013.01); *B81C 2203/0792* (2013.01)

(58) Field of Classification Search
CPC ............ B81C 1/00293; B81C 1/00301; B81C 1/00277
See application file for complete search history.

(56) References Cited

U.S. PATENT DOCUMENTS

| | | |
|---|---|---|
| 8,900,905 B1 | 12/2014 | Liu et al. |
| 9,085,455 B2 | 7/2015 | Cheng et al. |
| 2002/0000646 A1* | 1/2002 | Gooch ................. B81B 7/0077 257/666 |
| 2009/0134459 A1 | 5/2009 | Goto et al. |
| 2010/0058865 A1 | 3/2010 | Zhang et al. |

(Continued)

*Primary Examiner* — Anh D Mai
(74) *Attorney, Agent, or Firm* — Birch, Stewart, Kolasch & Birch, LLP

(57) ABSTRACT

A method for forming a micro-electro mechanical system (MEMS) device is provided. The method includes forming a first dielectric layer over a semiconductor layer and forming a blocking layer over the first dielectric layer. The method also includes bonding a CMOS substrate with the blocking layer, and the CMOS substrate includes a second dielectric layer, and the blocking layer is configured to block gas coming from the second dielectric layer. The method further includes partially removing the first dielectric layer to form a cavity between the semiconductor layer and the blocking layer. A portion of the semiconductor layer above the cavity becomes a movable element. In addition, the method includes sealing the cavity such that a closed chamber is formed to surround the movable element.

20 Claims, 15 Drawing Sheets

(56) References Cited

U.S. PATENT DOCUMENTS

| | | |
|---|---|---|
| 2011/0012247 A1 | 1/2011 | Wu |
| 2012/0042731 A1 | 2/2012 | Lin et al. |
| 2012/0061776 A1 | 3/2012 | Cheng et al. |
| 2012/0248615 A1 | 10/2012 | Chien et al. |
| 2012/0261830 A1 | 10/2012 | Chu et al. |
| 2013/0214400 A1 | 8/2013 | Shu et al. |
| 2013/0283912 A1 | 10/2013 | Lin |
| 2013/0334620 A1 | 12/2013 | Chu et al. |
| 2013/0334621 A1 | 12/2013 | Classen et al. |
| 2014/0252508 A1 | 9/2014 | Cheng et al. |
| 2014/0264648 A1 | 9/2014 | Chu et al. |
| 2014/0264744 A1 | 9/2014 | Chu et al. |
| 2015/0137276 A1 | 5/2015 | Cheng et al. |
| 2015/0137280 A1 | 5/2015 | Chu et al. |
| 2015/0175407 A1 | 6/2015 | Cheng et al. |

\* cited by examiner

US 10,486,964 B2

METHOD FOR FORMING A MICRO-ELECTRO MECHANICAL SYSTEM (MEMS) INCLUDING BONDING A MEMS SUBSTRATE TO A CMOS SUBSTRATE VIA A BLOCKING LAYER

CROSS REFERENCE

This application is a Divisional of U.S. application Ser. No. 14/049,988, filed on Oct. 9, 2013, the entirety of which is incorporated by reference herein.

BACKGROUND

The semiconductor integrated circuit (IC) has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component that can be created using a fabrication process) has decreased. Such advances have increased the complexity of processing and manufacturing ICs. For these advances, similar developments in IC processing and manufacturing are needed.

Micro-electro mechanical system (MEMS) devices have been recently developed. MEMS devices include devices fabricated using semiconductor technology to form mechanical and electrical features. The MEMS devices may include a number of elements (e.g., movable elements) for achieving mechanical functionality.

MEMS applications include motion sensors, pressure sensors, printer nozzles, or the like. Other MEMS applications include inertial sensors, such as accelerometers for measuring linear acceleration and gyroscopes for measuring angular velocity. Moreover, MEMS applications may extend to optical applications, such as movable mirrors, and radio frequency (RF) applications, such as RF switches or the like.

BRIEF DESCRIPTION OF THE DRAWINGS

For a more complete understanding of the embodiments, and the advantages thereof, reference is now made to the following descriptions taken in conjunction with the accompanying drawings.

DETAILED DESCRIPTION OF THE ILLUSTRATIVE EMBODIMENTS

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

The present disclosure will be described with respect to embodiments in a specific context, a micro-electro-mechanical system (MEMS) device. The embodiments of the disclosure may also be applied, however, to a variety of electrical or mechanical semiconductor devices. Hereinafter, various embodiments will be explained with reference to the accompany drawings. Some variations of the embodiments are described.

Figure 1:
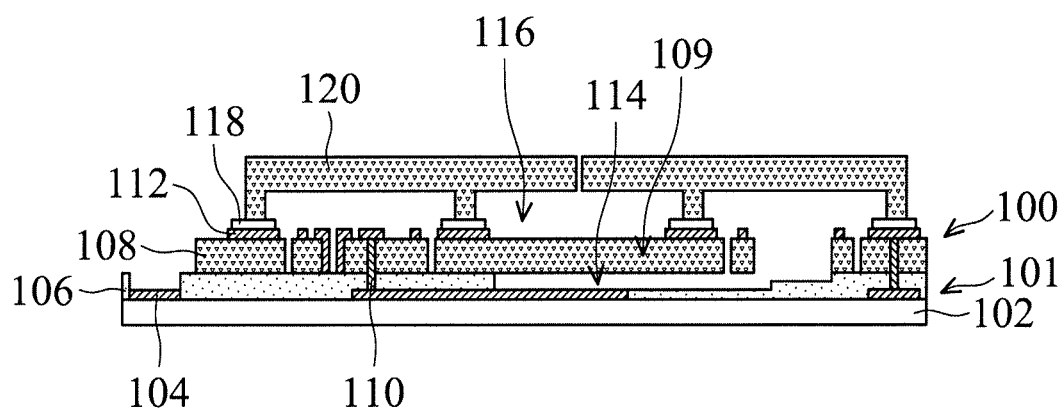
FIG. 1 is a cross-sectional view of a MEMS device, in accordance with some embodiments.

FIG. 1 is a cross-sectional view of a MEMS device 10, in accordance with some embodiments. The MEMS device 10 includes a MEMS substrate 100, a CMOS substrate 101, and a cap substrate 120. In some embodiments, the MEMS device 10 includes a pressure sensor. As shown in FIG. 1, the MEMS substrate 100 is sandwiched between the CMOS substrate 101 and the cap substrate 120.

Suitable bonding techniques may be used to bond the MEMS substrate 100, the CMOS substrate 101, and the cap substrate 120 together. The suitable bonding techniques may include fusion bonding, eutectic bonding, plasma activated bonding, thermocompression bonding, diffusion bonding, anodic bonding, other applicable bonding, or combinations thereof. Multiple cavities, including cavities 116 and 114, are formed. The cavity 116 is formed between the MEMS substrate 100 and the cap substrate 120, and the cavity 114 is formed between the MEMS substrate 100 and the CMOS substrate 101.

The CMOS substrate 101 includes a semiconductor substrate 102. The semiconductor substrate 102 may be made of silicon. Alternatively, the semiconductor substrate 102 may be made of other semiconductor materials, such as silicon germanium (SiGe), silicon carbide, other suitable semiconductor materials, or combinations thereof. Other substrates may also be used. For example, the semiconductor substrate 102 may include a multi-layered substrate, gradient substrate, hybrid orientation substrate, or combinations thereof. A wide variety of device elements, such as CMOS transistors, may be formed in/on the semiconductor substrate 102.

An interconnect structure is formed over the semiconductor substrate 102, as shown in FIG. 1. The interconnect structure includes a dielectric layer 106, which include multiple dielectric layers, and metal layers, which includes conductive pads 104. The conductive pads 104 may be electrically connected to the device elements formed in/on the semiconductor substrate 102, respectively. The conductive pad 104 may be used to provide electrical connections between the device elements and elements of the MEMS substrate 100.

As shown in FIG. 1, the MEMS substrate 100 is bonded with the CMOS substrate 101 and the cap substrate 120. The MEMS substrate 100 includes a semiconductor layer 108. The semiconductor layer 108 may be made of silicon or other applicable materials. The semiconductor layer 108 is patterned to have a variety of elements including a sensing element 109. The sensing element 109 is a movable element which is capable of bending, vibrating, deforming, or the like.

A conductive layer 112 may be formed over semiconductor layer 108. A conductive plug 110 may be formed between the conductive layer 112 and the conductive pad 104. Therefore, electrical connections between the elements of the MEMS substrate 100 and the device elements of the CMOS substrate 101 are established. The conductive layer 112 may also be used to bond with the cap substrate 120 through a bonding layer 118. The bonding layer 118 may be made of a semiconductor material, metal material, dielectric material, polymer material, other applicable materials, or combinations thereof.

In some embodiments, the sensing element 109 is a pliable diaphragm. The diaphragm is configured to measure a pressure within an adjacent cavity, such as the cavity 116, based upon capacitance changes caused by a force that the pressure exerts on the diaphragm. For example, a high pressure existent within the cavity 116 could cause the diaphragm to bend towards the cavity 114 more than a low pressure. As shown in FIG. 1, the cavity 114 may be a closed chamber with high vacuum. Therefore, the diaphragm could bend towards the cavity 114 more easily. The sensitivity of the pressure sensor depends on the degree of vacuum of the cavity 114.

In some embodiments, however, the degree of vacuum of the cavity 114 may be gradually decreased due to the gas coming from dielectric materials surrounding the cavity 114. For example, impurity gas may come from the dielectric layer 106 to reduce the degree of vacuum of the cavity 114. As a result, the bending of the sensing element 109 is negatively influenced such that the sensitivity of the pressure sensor is reduced.

Therefore, it is desired to find alternative mechanisms for forming a MEMS device to reduce or resolve the problems mentioned above. FIGS. 2A-2M are cross-sectional views of various stages of a process for forming a MEMS device, in accordance with some embodiments.

Figure 2A:
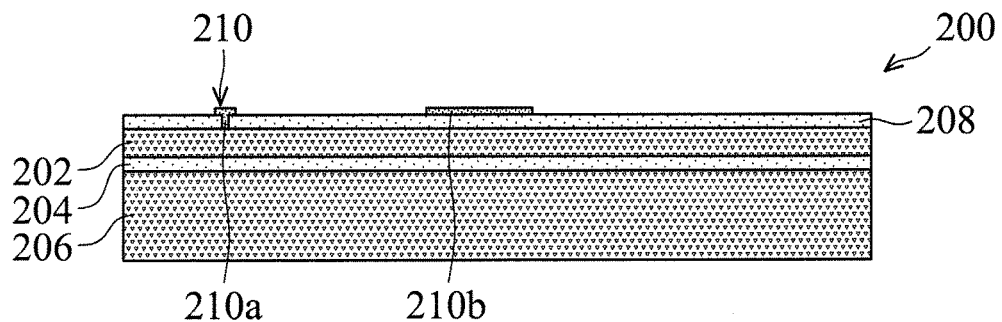
FIGS. 2A-2M are cross-sectional views of various stages of a process for forming a MEMS device, in accordance with some embodiments.

As shown in FIG. 2A, a MEMS substrate 200 (or a MEMS wafer) is provided, in accordance with some embodiments. The MEMS substrate 200 may be a semiconductor on insulator (SOI) substrate, which includes a semiconductor substrate 206, an insulator layer 204, and a semiconductor layer 202. The semiconductor layer 202 may be made of silicon, germanium, and/or other applicable materials. The semiconductor substrate 206 may be a silicon substrate, and the insulator layer 204 may be a buried oxide layer formed between the semiconductor layer 202 and the semiconductor substrate 206. The semiconductor layer 202 may have a thickness in a range from about 2 μm to about 5 μm.

In some other embodiments, the MEMS substrate 200 includes a bulk semiconductor substrate other than the SOI substrate. For example, the bulk semiconductor substrate is made of silicon, germanium, silicon carbide, or the like. Alternatively, other substrates that may be used include multi-layered substrates, gradient substrates, hybrid orientation substrates, and/or the like.

As shown in FIG. 2A, a dielectric layer 208, such as a silicon oxide layer or other suitable materials, is deposited over the semiconductor layer 202. The dielectric layer 208 may be deposited by using a chemical vapor deposition (CVD) process, spin-on process, or other applicable processes. Afterwards, the dielectric layer 208 is patterned to form one or more contact holes in the dielectric layer 208. The contact holes may expose the semiconductor layer 202 underlying the dielectric layer 208.

As shown in FIG. 2A, a conductive layer 210 is deposited and patterned over the dielectric layer 208, in accordance with some embodiments. The conductive layer 210 is made of a conductive material having a high melting point, such as higher than about 900 degree C. In some embodiments, the conductive layer 210 is made of a semiconductor material, such as polysilicon. The conductive layer 210 may be deposited by using a CVD process, physical vapor deposition (PVD) process, or other applicable processes. The conductive layer 210 may be doped with n-type impurities or p-type impurities to have a suitable conductivity.

The conductive layer 210 is patterned into multiple portions including portions 210a and 210b, in accordance with some embodiments. The portion 210a is used as a contact element electrically connected to the semiconductor layer 202 below, and the portion 210b is used as an electrode element. The portions 210a and 210b are electrically connected to each other such that electrical signals are capable of being transferred between the contact element and the electrode element. However, it should be appreciated that embodiments of the disclosure are not limited to the embodiments mentioned above. The conductive layer 210 may have a different layout. In some other embodiments, the portion 210a is not electrically connected to the portion 210b.

Figure 2B:
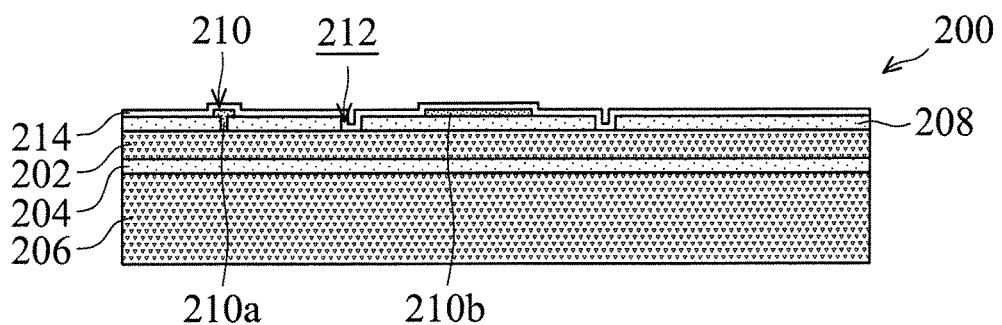

As shown in FIG. 2B, the dielectric layer 208 is patterned to form recesses 212 in the dielectric layer 208, in accordance with some embodiments. The recesses 212 may be used to define a cavity region. The recesses 212 may expose the semiconductor layer 202 under the dielectric layer 208.

Afterwards, an etch stop layer 214 is deposited over the dielectric layer 208, the conductive layer 210, and the semiconductor layer 202, in accordance with some embodiments. The etch stop layer 214 may be conformally deposited over sidewalls and bottoms of the recesses 212. The etch stop layer 214 may be made of silicon nitride, aluminum oxide, silicon carbide, other applicable materials, or combinations thereof. In some embodiments, the etch stop layer 214 is a low stress silicon nitride layer, which can also function as a blocking layer to prevent gas from penetrating through the etch stop layer 214. The etch stop layer 214 may be deposited by using a CVD process (such as a LPCVD process), spin-on process, or other applicable processes. The stress of the low stress silicon nitride layer may be in a range from about −50 MPa to about 50 MPa.

Figure 2C:
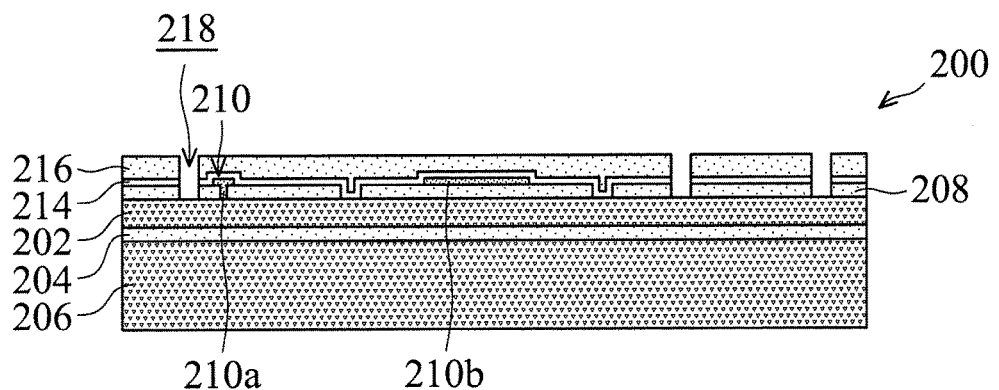

As shown in FIG. 2C, a dielectric layer 216 is deposited over the etch stop layer 214, in accordance with some embodiments. The dielectric layer 216 may be made of silicon oxide or other suitable materials. A CVD process or the like may be performed to deposit the dielectric layer 216. A planarization process, such as a CMP process, may be performed on the dielectric layer 216. Afterwards, the dielectric layer 216 is patterned to form multiple via openings 218. The via openings 218 may penetrate through the dielectric layer 216, the etch stop layer 214, and the dielectric layer 208 and expose the semiconductor layer 202.

In some embodiments, the MEMS substrate 200 is annealed at a high temperature to induce the outgassing of the dielectric layers including the dielectric layers 216 and 208. Therefore, the dielectric layers contain less gas after being annealed. The degree of vacuum of a cavity to be formed could be maintained more easily. For example, the MEMS substrate 200 is annealed at a temperature higher than about 900 degree C.

In some embodiments, the MEMS substrate 200 is annealed after the via openings 218 are formed. In some embodiments, the MEMS substrate 200 is annealed after the deposition of the dielectric layer 216 and before the patterning of the dielectric layer 216. Since there is no metal line formed in the MEMS substrate 200, the annealing process could reduce the gas, coming from the dielectric layers 208 and 216, without destroying elements which have been formed in the MEMS substrate 200.

Figure 2D:
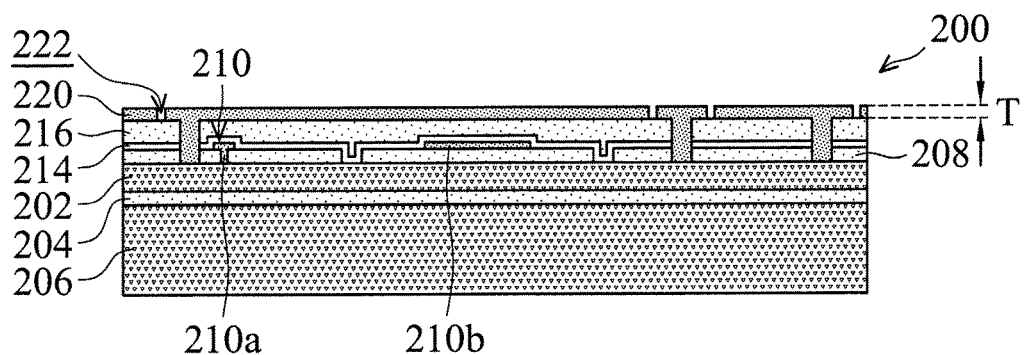

As shown in FIG. 2D, a blocking layer 220 is deposited over the dielectric layer 216 and the semiconductor layer 202 exposed by the via openings 218, in accordance with some embodiments. The blocking layer 220 is used to stop the gas coming from dielectric layers, such as those of a CMOS substrate (not shown in FIG. 2D) to be bonded with the MEMS substrate 200. The blocking layer 220 may be made of a semiconductor material, dielectric material, or other applicable materials. For example, the blocking layer 220 is made of polysilicon.

The blocking layer 220 may be deposited by using a CVD process, spin-on process, or other appropriate processes. In some embodiments, the blocking layer 220 fills the via openings 218. If the blocking layer 220 is electrically conductive, the blocking layer 220 may be patterned to form recesses 222 to separate the blocking layer 220 into multiple isolated portions. Therefore, short circuiting is prevented. In some embodiments, the blocking layer 220 also functions as an electrical shielding. Electromagnetic interference caused by neighboring elements, such as those of a CMOS substrate (not shown in FIG. 2D) to be bonded with the MEMS substrate 200, may be prevented by the blocking layer 220.

In some embodiments, the materials of the blocking layer 220 and the conductive layer 210 are substantially the same. For example, both the blocking layer 220 and the conductive layer 210 are made of polysilicon. In some other embodiments, both the blocking layer 220 and the conductive layer 210 are polysilicon layers with different doping concentrations. For example, the conductive layer 210 is a polysilicon layer with a higher doping concentration than the blocking layer 220. In some embodiments, the blocking layer 220 over the dielectric layer 216 has a thickness T, that is in a range from about 0.5 μm to about 10 μM. The blocking layer 220 may be thicker than the conductive layer 210.

Figure 2E:
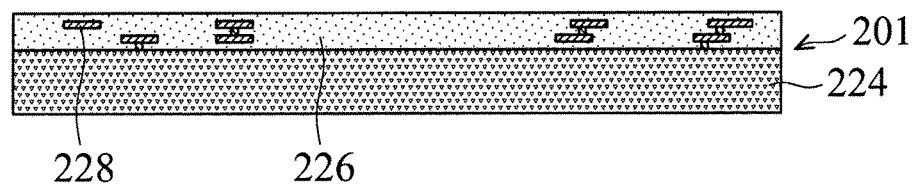

As shown in FIG. 2E, a CMOS substrate 201 (or a CMOS wafer) is provided, in accordance with some embodiments. The CMOS substrate 201 includes a semiconductor substrate 224 and a dielectric layer 226. The dielectric layer 226 includes multiple dielectric layers. Multiple conductive features (such as lines, vias, and contacts) are formed in the dielectric layer 226. The conductive features include conductive pads 228. Each of the conductive pads 228 is electrically connected to a region or a device element formed in/on the semiconductor substrate 224. In some embodiments, the dielectric layer 226 has a planarized top surface, which is, for example, a planarized oxide surface. The conductive pads 228 (or the top metal) may be buried under the planarized top surface.

Figure 2F:
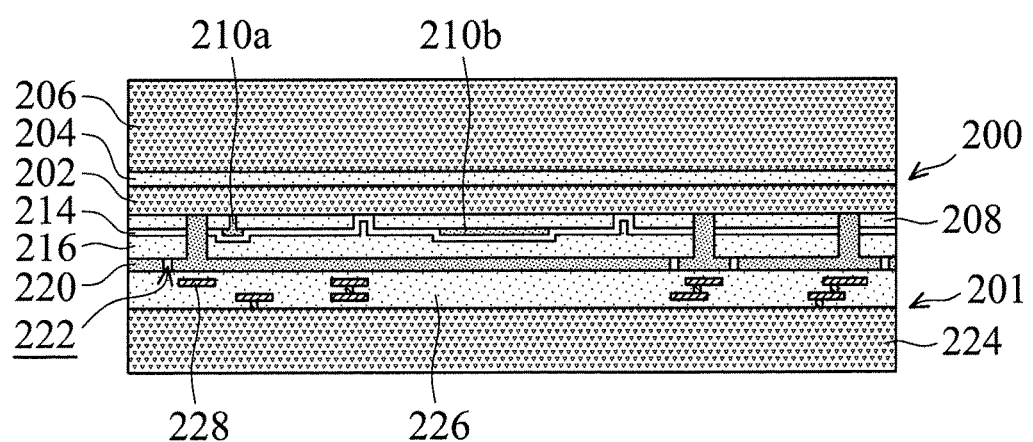

As shown in FIG. 2F, the MEMS substrate 200 and the CMOS substrate 201 are aligned and bonded with each other, in accordance with some embodiments. A fusion bonding process or other applicable processes may be performed to bond the blocking layer 220 and the planarized top surface of the dielectric layer 226 together. In some embodiments, the blocking layer 220 is in direct contact with the dielectric layer 226. Some of the conductive pads 228 are substantially aligned with the blocking layer 220 filling the via openings 218 (shown in FIG. 2C).

Figure 2G:
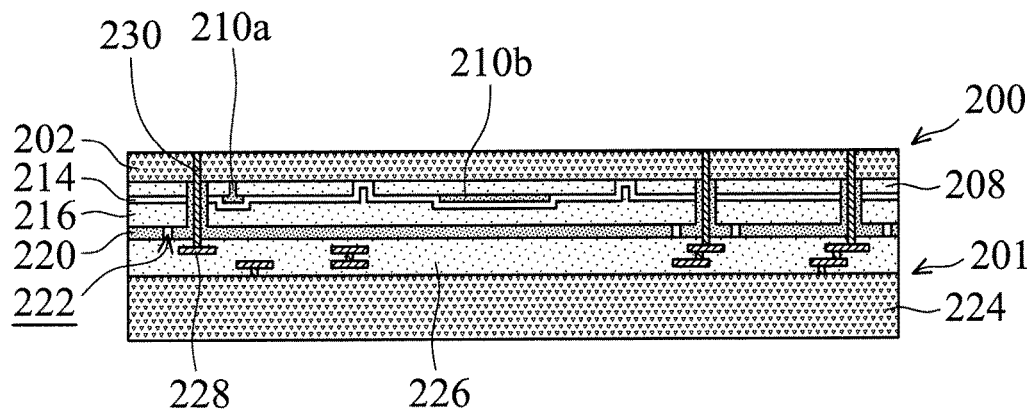

Afterwards, as shown in FIG. 2G, the MEMS substrate 200 is thinned, in accordance with some embodiments. For example, the semiconductor substrate 206 and the insulator layer 204 are sequentially removed such that the MEMS substrate 200 is thinned and the semiconductor layer 202 is exposed. The semiconductor substrate 206 and the insulator layer 204 may be removed by using suitable processes. The suitable processes include a mechanical grinding process, chemical mechanical polishing (CMP) process, etching process, other applicable processes, or combinations thereof. Alternatively, a mechanical grinding process or the like may be performed to thin down the MEMS substrate 200.

As shown in FIG. 2G, conductive plugs 230 are formed to electrically connect to the conductive pads 228, in accordance with some embodiments. Each of the conductive plugs 230 penetrates through the semiconductor layer 202, the blocking layer 220, and the dielectric layer 226 to electrically contact with the corresponding one of the conductive pads 228. In some embodiments, the conductive plugs 230 are in direct contact with the blocking layer 220. Each of the conductive plugs 230 may have a single width.

In some embodiments, a photolithography process and multiple etching processes are performed to form a number of via openings. Each of the via openings exposes a corresponding one of the conductive pads 228. For example, a first etching process is performed to partially remove the semiconductor layer 202 and the blocking layer 220 to form a through hole until the dielectric layer 226 is exposed. Afterwards, a second etching process is performed to partially remove the dielectric layer 226 such that the conductive pads 228 are exposed. As a result, the via openings are formed. Different etchants may be used in the first and the second etching processes.

After the forming of the via openings, a conductive material may be deposited to fill the via openings to form the conductive plugs 230. In some embodiments, a planarization process, such as a CMP process, is performed to remove the conductive material outside of the via openings. The conductive material may be made of tungsten, copper, titanium, nickel, gold, other suitable materials, or combinations thereof. The conductive material may be deposited by using a CVD process, plating process, PVD process, other applicable processes, or combinations thereof.

Figure 2H:
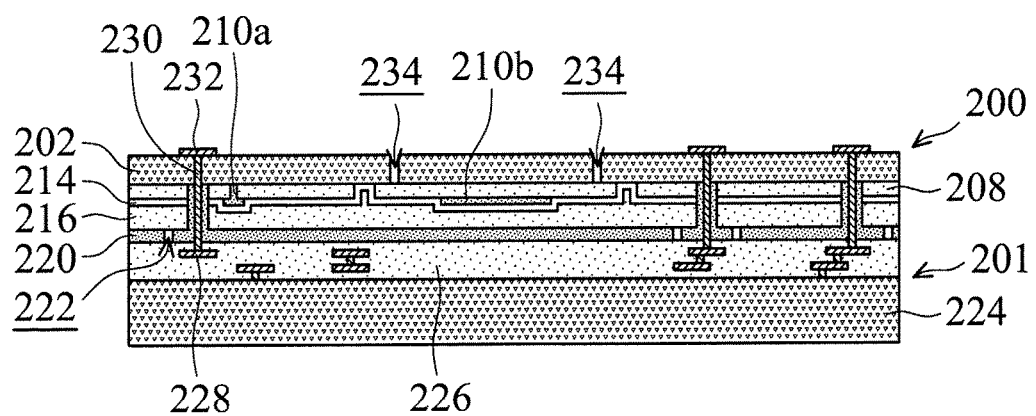

As shown in FIG. 2H, conductive pads 232 are formed over the semiconductor layer 202 to electrically contact with the conductive plugs 230, in accordance with some embodiments. The conductive pads 232 may be made of copper, aluminum, gold, other applicable materials, or combinations thereof. A metal layer may be deposited and patterned over the semiconductor layer 202 to form the conductive pads 232.

As shown in FIG. 2H, one or more release holes 234 are formed in the semiconductor layer 202 to expose the dielectric layer 208, in accordance with some embodiments. A photolithography process and an etching process may be performed to form the release holes 234.

Figure 2I:
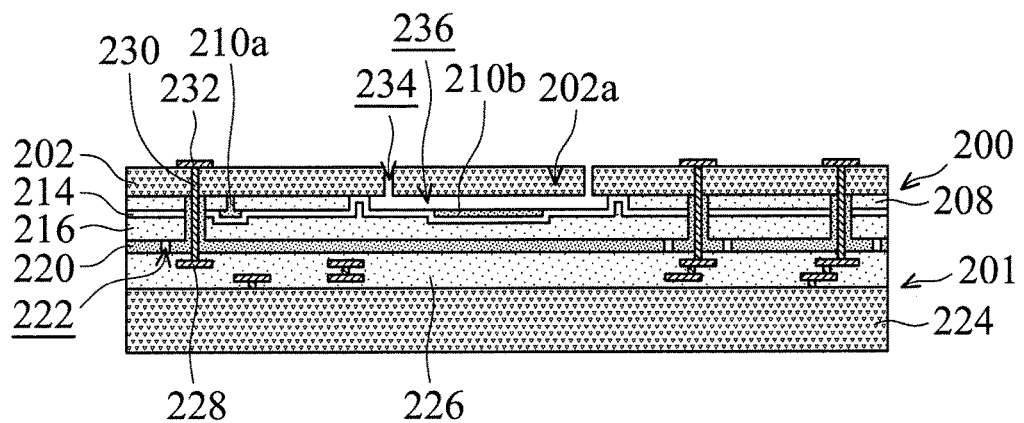

As shown in FIG. 2I, a portion of the dielectric layer 208 is removed through the release holes 234 to form a cavity 236, in accordance with some embodiments. An etching process is performed to partially remove the dielectric layer 208. For example, a vapor HF is used as the etchant to remove the dielectric layer 208. Therefore, the cavity 236, surrounded by the etch stop layer 214, is formed. The etch stop layer 214 prevents the dielectric layer 216 and the portion of the dielectric layer 208 adjacent to the cavity 236 from being etched. After the cavity 236 is formed, a portion of the semiconductor layer 202 becomes a movable element 202a. That is, the movable element 202a is released from the dielectric layer 208. The movable element 202a is capable of bending, vibrating, deforming, or the like. In some embodiments, the movable element 202a serves as a sensing element.

Figure 3:
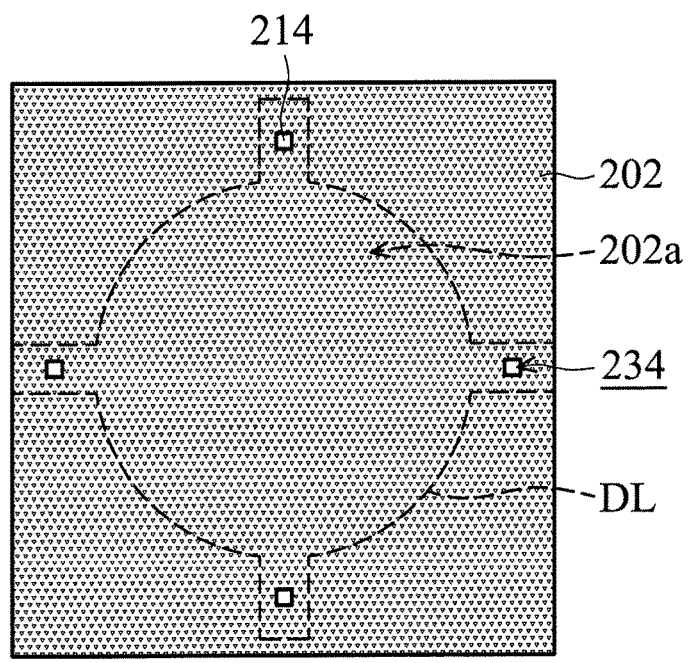
FIG. 3 is a top view of an intermediate stage of a process for forming a MEMS device, in accordance with some embodiments.

FIG. 3 is a top view of an intermediate stage of a process for forming a MEMS device, in accordance with some embodiments. A top view of a portion of the semiconductor layer 202 is shown. A dotted line DL represents an exemplary region of the dielectric layer 208 which is etched through the release holes 234. The dotted line DL also shows the periphery of the movable element 202a.

It should be appreciated that the movable element 202a is not limited to be released through the release holes 234. In some other embodiments, the dielectric layer 208 under the movable element 202a is removed by other methods. In some other embodiments, the etch stop layer 214 is not formed.

Figure 2J:
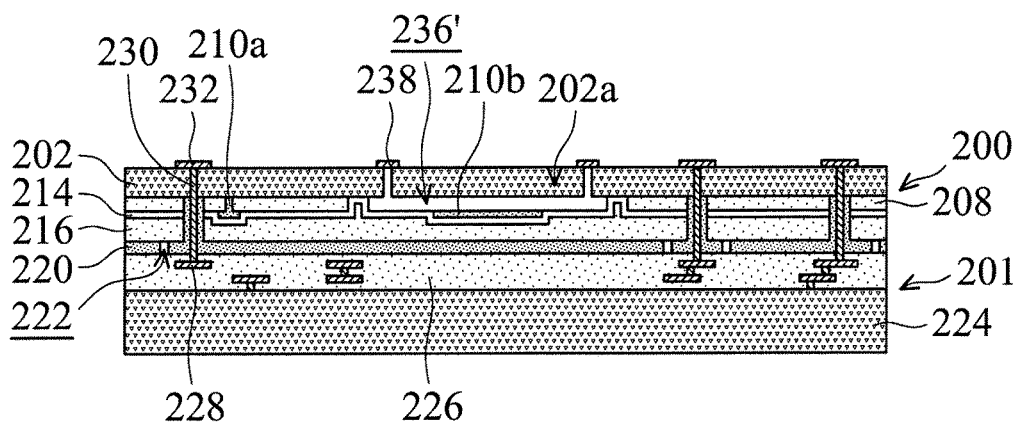

As shown in FIG. 2J, the cavity 236 is vacuumized and sealed by sealing elements 238, in accordance with some embodiments. The sealing elements 238 may be made of a metal material, dielectric material, semiconductor material, other applicable materials, or combinations thereof. In some embodiments, a sealing layer is deposited over the semiconductor layer 202 and patterned to be the sealing elements 238. The sealing layer is deposited by using a PVD process, CVD process, other applicable processes, or combinations thereof. In some embodiments, a portion of the sealing layer is deposited over the etch stop layer 214 below the release hole 234. An upper portion of the sidewall of the release hole 234 may also be covered by the sealing layer.

In some embodiments, the structure shown in FIG. 2I is disposed into a deposition tool to deposit the sealing layer. The deposition tool may be a PVD deposition tool, such as a sputtering tool. The structure shown in FIG. 2I is disposed into a process chamber which is vacuumized. After the deposition and patterning of the sealing elements 238 as shown in FIG. 2J, a closed chamber 236' sealed by the sealing elements 238 is formed. The cavity 236 now becomes a portion of the closed chamber 236'. The closed chamber 236' surrounds the movable element 202a. The closed chamber 236' may have a pressure in a range from about 10E-7 torr to about 1 torr.

In some embodiments, the sealing elements 238 and the conductive pads 232 are simultaneously formed. That is, the conductive pads 232 are not limited to be formed during the stage shown in FIG. 2H. In some embodiments, a metal layer is deposited over the semiconductor layer 202 and patterned to be the sealing elements 238 and the conductive pads 232 as shown in FIG. 2J. In these cases, the sealing elements 238 and the conductive pads 232 are made of the same material.

Figure 2K:
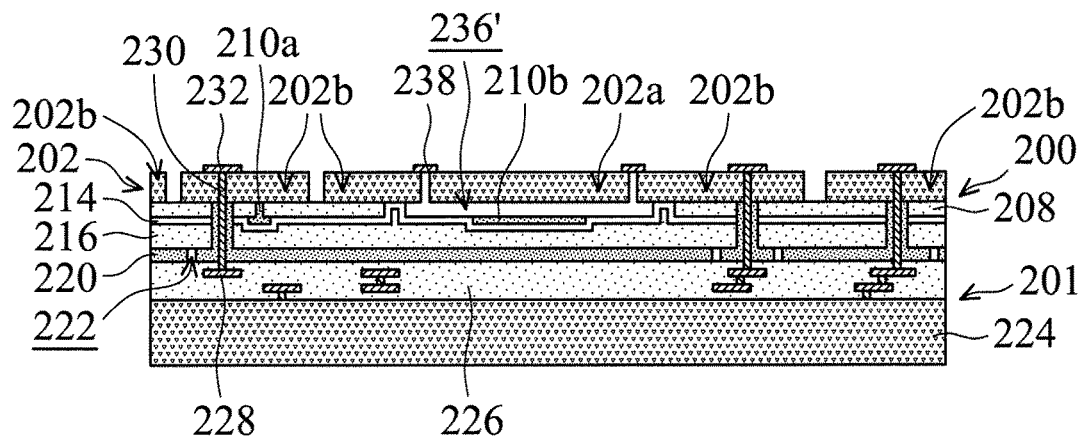

As shown in FIG. 2K, the semiconductor layer 202 is patterned to form a number of elements including elements 202b, in accordance with some embodiments. Some or all of the elements 202b are electrically isolated from the movable element 202a. Some or all of the elements 202b are electrically isolated from each other. A photolithography process and an etching process may be performed to partially remove the semiconductor layer 202 and pattern the semiconductor layer 202.

Figure 2L:
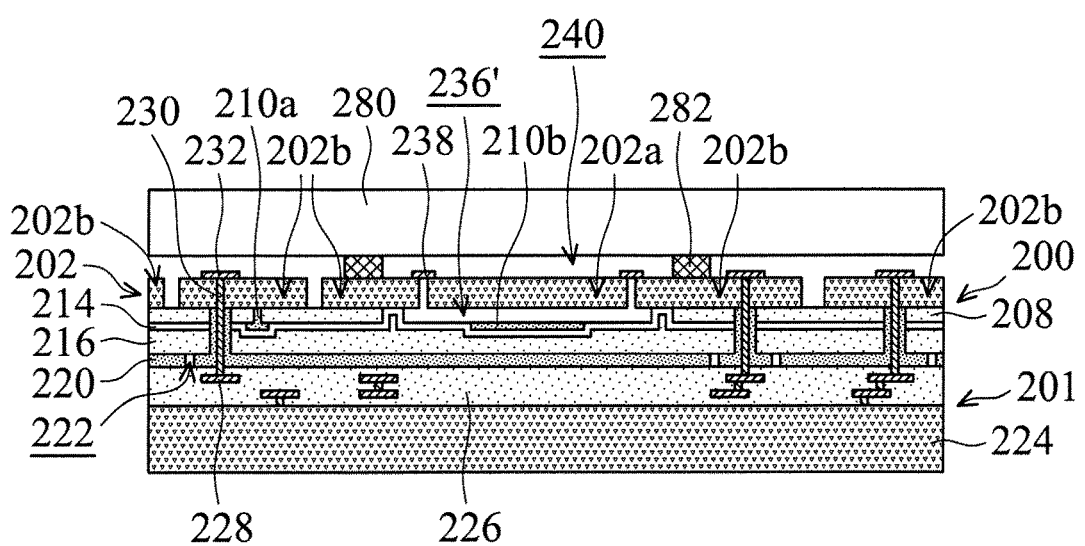

As shown in FIG. 2L, a cap substrate 280 (or a cap wafer) is bonded with the MEMS substrate 200, in accordance with some embodiments. The cap substrate 280 prevents or reduces particle issues. The cap substrate 280 may be made of a semiconductor material, dielectric material, polymer material, other applicable materials, or combinations thereof. Suitable bonding techniques may be used to bond the cap substrate 280 and the MEMS substrate 200 together. The suitable bonding techniques may include fusion bonding, eutectic bonding, plasma activated bonding, thermocompression bonding, diffusion bonding, anodic bonding, other applicable bonding, or combinations thereof. In some embodiments, the cap substrate 280 is bonded with the semiconductor layer 202 of the MEMS substrate 200 through one or more bonding structures 282. The bonding structures 282 may be made of a metal material, polymer material, dielectric material, semiconductor material, other applicable materials, or combinations thereof.

After the bonding between the MEMS substrate 200 and the cap substrate 280, a cavity 240 is formed between the semiconductor layer 202 and the cap substrate 280. The cavity 240 is surrounded by the bonding structures 282. In some embodiments, the bonding structures 282 do not completely seal the cavity 240. The cavity 240 is connected to the environment. As a result, the pressure of the environment can be detected. The cavity 240 may have a pressure which is higher than that of the closed chamber 236'. Embodiments of the disclosure have many variations. In some embodiments, the cap substrate 280 and the bonding structures 282 are not formed.

Figure 2M:
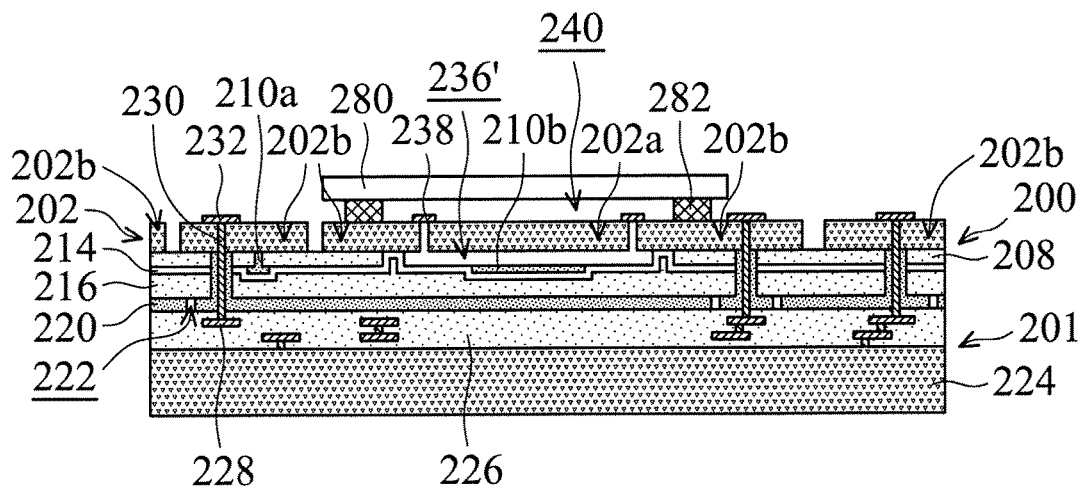

As shown in FIG. 2M, the cap substrate 280 is patterned such that the conductive pads 232 are exposed, in accordance with some embodiments. The cap substrate 280 may be thinned before being patterned. The cap substrate 280 may be patterned by using a dicing saw. The MEMS substrate 200 and the CMOS substrate 201 may also be diced to form multiple MEMS devices separated from each other.

As shown in FIG. 2M, the blocking layer 220 is formed between the closed chamber 236' and the dielectric layer 226 of the CMOS substrate 201. Therefore, any gas coming from the dielectric layer 226 is blocked. The degree of vacuum of the closed chamber 236' is maintained. The dielectric layers 208 and 216 have been annealed at the high temperature. Thus, there is almost no gas, coming from the dielectric layers 208 and 216, would enter the closed chamber 236'. As shown in FIG. 2M, the etch stop layer 214 may also function as a blocking layer to maintain the degree of vacuum of the closed chamber 236'. Since the degree of vacuum is maintained, the sensitivity and performance of the MEMS device are greatly improved.

In the embodiments shown in FIGS. 2A-2M, the movable element 202a is released after the conductive plugs 230 are formed. However, it should be appreciated that embodiments of the disclosure are not limited thereto. In some embodiments, the sensing element is released before the conductive plugs, electrically connecting the MEMS substrate and the CMOS substrate, are formed.

FIGS. 4A-4L are cross-sectional views of various stages of a process for forming a MEMS device, in accordance with some embodiments. Like reference numbers are used to designate like elements.

Figure 4A:
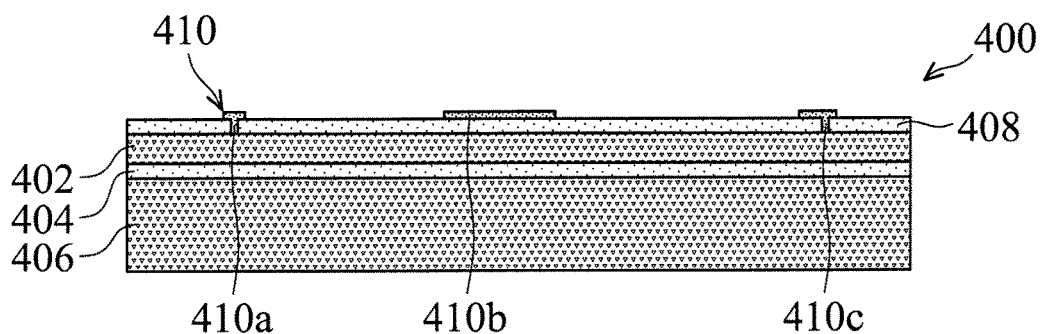
FIGS. 4A-4L are cross-sectional views of various stages of a process for forming a MEMS device, in accordance with some embodiments.

As shown in FIG. 4A, a MEMS substrate 400 (or a MEMS wafer) is provided, in accordance with some embodiments. The MEMS substrate 400 may be a semiconductor on insulator (SOI) substrate, which includes a semiconductor substrate 406, an insulator layer 404, and a semiconductor layer 402. The SOI substrate may be similar to that shown in FIG. 2A.

In some other embodiments, the MEMS substrate 400 includes a bulk semiconductor substrate. For example, the bulk semiconductor substrate is made of silicon, germanium, silicon carbide, or the like. Alternatively, other substrates that may be used include multi-layered substrates, gradient substrates, hybrid orientation substrates, and/or the like.

As shown in FIG. 4A, a dielectric layer 408, such as a silicon oxide layer or other suitable materials, is deposited over the semiconductor layer 402. The dielectric layer 408 may be deposited by using a chemical vapor deposition (CVD) process, spin-on process, or other applicable processes. Afterwards, the dielectric layer 408 is patterned to form one or more contact holes in the dielectric layer 408. The contact holes may expose the semiconductor layer 402 underlying the dielectric layer 408.

As shown in FIG. 4A, a conductive layer 410 is deposited and patterned over the dielectric layer 408, in accordance with some embodiments. The material and the formation method of the conductive layer 410 may be similar to those of the conductive layer 210. The conductive layer 410 may be doped with n-type impurities or p-type impurities to have a suitable conductivity.

The conductive layer 410 is patterned into multiple portions including portions 410a, 410b, and 410c, in accordance with some embodiments. The portions 410a and 410c are used as contact elements electrically connected to the semiconductor layer 402 below, and the portion 410b is used as an electrode element. The portion 410c may be used for grounding or the like. The portions 410a and 410b are electrically connected to each other such that electrical signals are capable of being transferred between the contact element and the electrode element. However, it should be appreciated that embodiments of the disclosure are not limited to the embodiments mentioned above. The conductive layer 410 may have a different layout. In some other embodiments, the portion 410a is not electrically connected to the portion 410b.

Figure 4B:
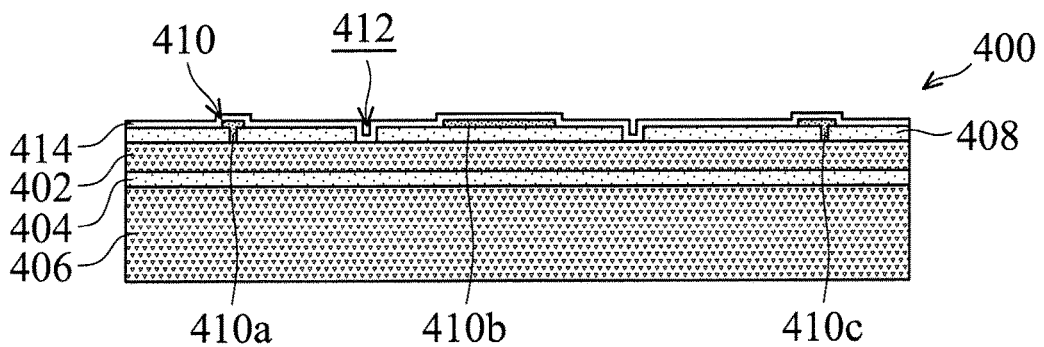

As shown in FIG. 4B, the dielectric layer 408 is patterned to form recesses 412 in the dielectric layer 408, in accordance with some embodiments. The recesses 412 may be used to define a cavity region. The recesses 412 may expose the semiconductor layer 402 under the dielectric layer 408.

Afterwards, an etch stop layer 414 is deposited over the dielectric layer 408, the conductive layer 410, and the semiconductor layer 402, in accordance with some embodiments. The etch stop layer 414 may be conformally deposited over sidewalls and bottoms of the recesses 412. The material and the formation method of the etch stop layer 414 may be similar to those of the etch stop layer 214. In some embodiments, the etch stop layer 414 is a low stress silicon nitride layer, which can also function as a blocking layer to prevent gas from penetrating through the etch stop layer 414.

Figure 4C:
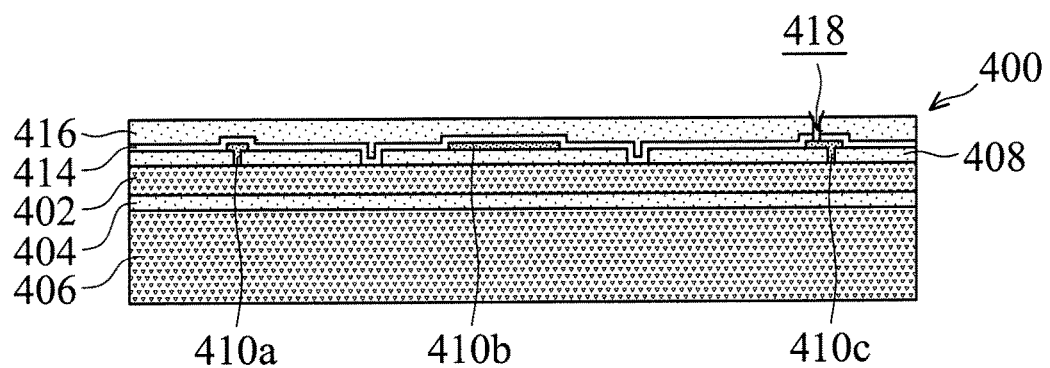

As shown in FIG. 4C, a dielectric layer 416 is deposited over the etch stop layer 414, in accordance with some embodiments. The material and the formation method of the dielectric layer 416 may be similar to those of the dielectric layer 216. Afterwards, the dielectric layer 416 is patterned to form a via openings 418. The via opening 418 may penetrate through the dielectric layer 416 and the etch stop layer 414 and expose the portion 410c of the conductive layer 410.

In some embodiments, the MEMS substrate 400 is annealed at a high temperature to induce the outgassing of the dielectric layers including the dielectric layers 416 and 408. Therefore, the dielectric layers contain less gas after being annealed. The degree of vacuum of a cavity to be formed can be maintained more easily. For example, the MEMS substrate 400 is annealed at a temperature higher than about 900 degree C.

In some embodiments, the MEMS substrate 400 is annealed after the via opening 418 is formed. In some embodiments, the MEMS substrate 400 is annealed after the deposition of the dielectric layer 416 and before the patterning of the dielectric layer 416. Since there is no metal line formed in the MEMS substrate 400, the annealing process could reduce the gas, coming from the dielectric layers 408 and 416, without destroying elements which have been formed in the MEMS substrate 400.

Figure 4D:
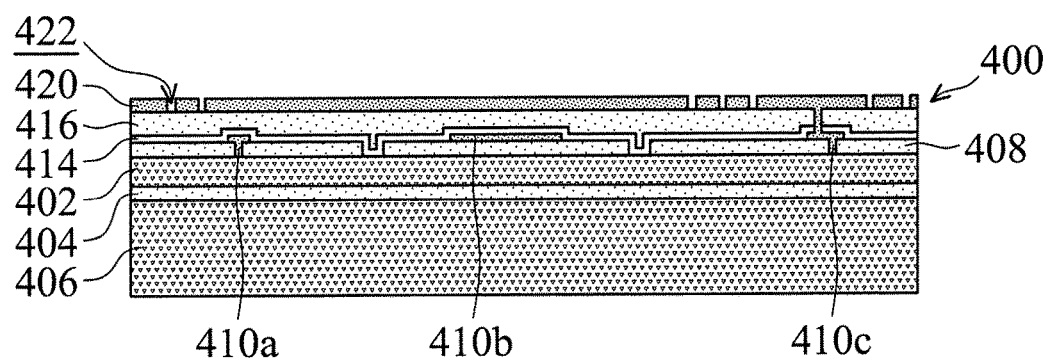

As shown in FIG. 4D, a blocking layer 420 is deposited over the dielectric layer 416 and the portion 410c of the conductive layer 410 exposed by the via opening 418, in accordance with some embodiments. The material and the formation method of the blocking layer 420 may be similar to those of the blocking layer 220. The blocking layer 420 is used to stop the gas coming from dielectric layers, such as the dielectric layers of a CMOS substrate (not shown in FIG. 4D) to be bonded with the MEMS substrate 400.

In some embodiments, the blocking layer 420 fills the via opening 418. If the blocking layer 420 is electrically conductive, the blocking layer 420 may be patterned to form recesses 422 to separate the blocking layer 420 into multiple isolated portions. Therefore, short circuiting is prevented. In some embodiments, the blocking layer 420 also functions as an electrical shielding. Electromagnetic interference caused by neighboring elements, such as those of a CMOS substrate (not shown in FIG. 4D) to be bonded with the MEMS substrate 400, may be prevented by the blocking layer 420.

In some embodiments, the materials of the blocking layer 420 and the conductive layer 410 are substantially the same. For example, both the blocking layer 420 and the conductive layer 410 are made of polysilicon. In some other embodiments, both the blocking layer 420 and the conductive layer 410 are polysilicon layers with different doping concentrations. For example, the conductive layer 410 is a polysilicon layer with a higher doping concentration than the blocking layer 420. In some embodiments, the blocking layer 420 over the dielectric layer 416 has a thickness in a range from about 0.5 μm to about 10 μm. The blocking layer 420 may be thicker than the conductive layer 410.

Figure 4E:
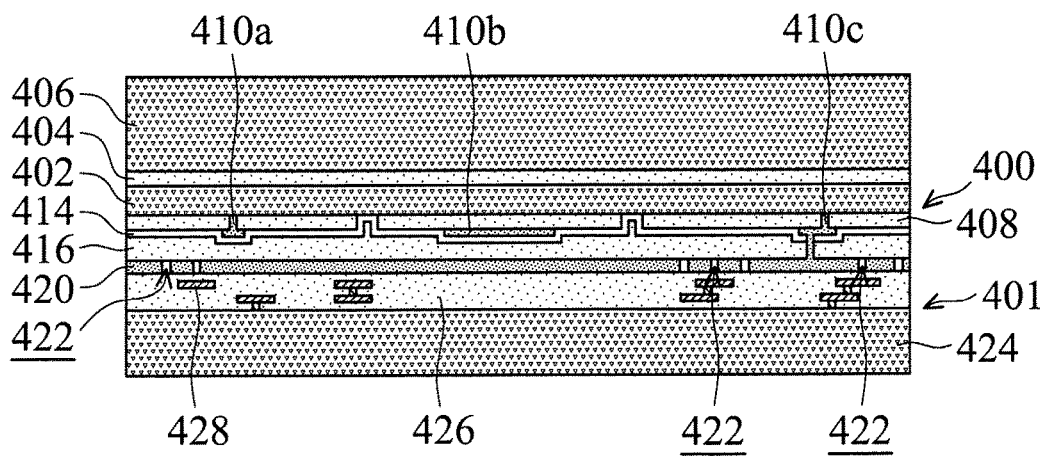

As shown in FIG. 4E, a CMOS substrate 401 (or a CMOS wafer) is provided, and the MEMS substrate 400 and the CMOS substrate 401 are aligned and bonded with each other, in accordance with some embodiments. The CMOS substrate 401 includes a semiconductor substrate 424 and a dielectric layer 426. The dielectric layer 426 includes multiple dielectric layers. Multiple conductive features (such as lines, vias, and contacts) are formed in the dielectric layer 426. The conductive features include conductive pads 428. Each of the conductive pads 428 is electrically connected to a region or a device element formed in/on the semiconductor substrate 424. In some embodiments, the dielectric layer 426 has a planarized top surface, which is, for example, a planarized oxide surface. The conductive pads 428 (or the top metal) may be buried under the planarized top surface.

A fusion bonding process or other applicable processes may be performed to bond the blocking layer 420 and the planarized top surface of the dielectric layer 426 together. In some embodiments, the blocking layer 420 is in direct contact with the dielectric layer 426. Some of the conductive pads 428 are substantially aligned with some of the recesses 422 in the blocking layer 420, respectively.

Figure 4F:
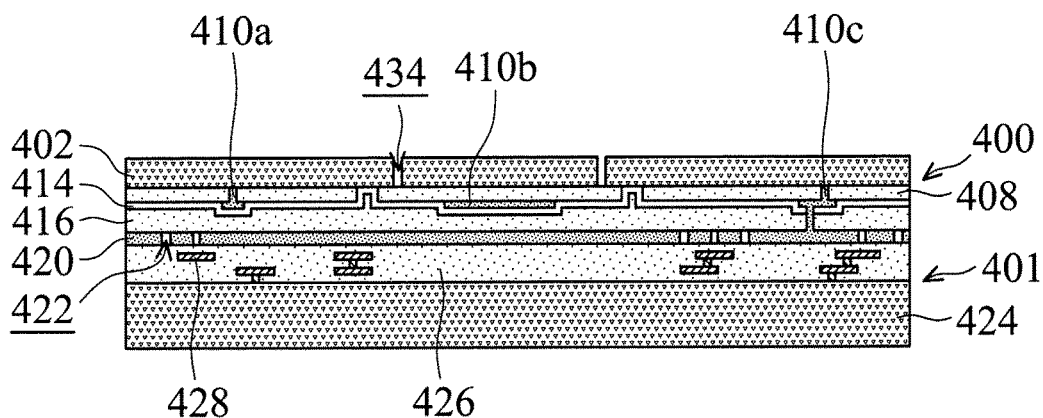

Afterwards, as shown in FIG. 4F, the MEMS substrate 400 is thinned, in accordance with some embodiments. For example, the semiconductor substrate 406 and the insulator layer 404 are sequentially removed such that the MEMS substrate 400 is thinned and the semiconductor layer 402 is exposed. The semiconductor substrate 406 and the insulator layer 404 may be removed by using suitable processes. The suitable processes include a mechanical grinding process, chemical mechanical polishing (CMP) process, etching process, other applicable processes, or combinations thereof. Alternatively, a mechanical grinding process may be performed to thin down the MEMS substrate 400.

As shown in FIG. 4F, one or more release holes 434 are formed in the semiconductor layer 402 to expose the dielectric layer 408, in accordance with some embodiments. A photolithography process and an etching process may be performed to form the release holes 434.

Figure 4G:
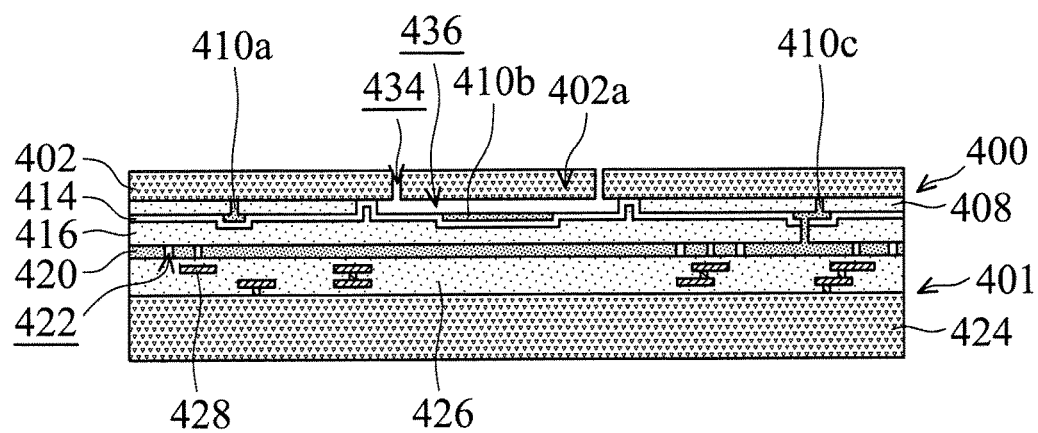

As shown in FIG. 4G, a portion of the dielectric layer 408 is removed through the release holes 434 to form a cavity 436, in accordance with some embodiments. An etching process is performed to partially remove the dielectric layer 408. For example, a vapor HF is used as the etchant to remove the dielectric layer 408. Therefore, the cavity 436, surrounded by the etch stop layer 414, is formed. The etch stop layer 414 prevents the dielectric layer 416 and the portion of the dielectric layer 408 adjacent to the cavity 436 from being etched. After the cavity 436 is formed, a portion of the semiconductor layer 402 becomes a movable element 402a. That is, the movable element 402a is released from the dielectric layer 408. The movable element 402a is capable of bending, vibrating, deforming, or the like. In some embodiments, the movable element 402a serves as a sensing element. In some embodiments, a top view of the semiconductor layer 402 is similar to that of the semiconductor layer 202 shown in FIG. 3. In some embodiments, the release holes 434 are not formed. In some embodiments, the etch stop layer 414 is not formed.

Figure 4H:
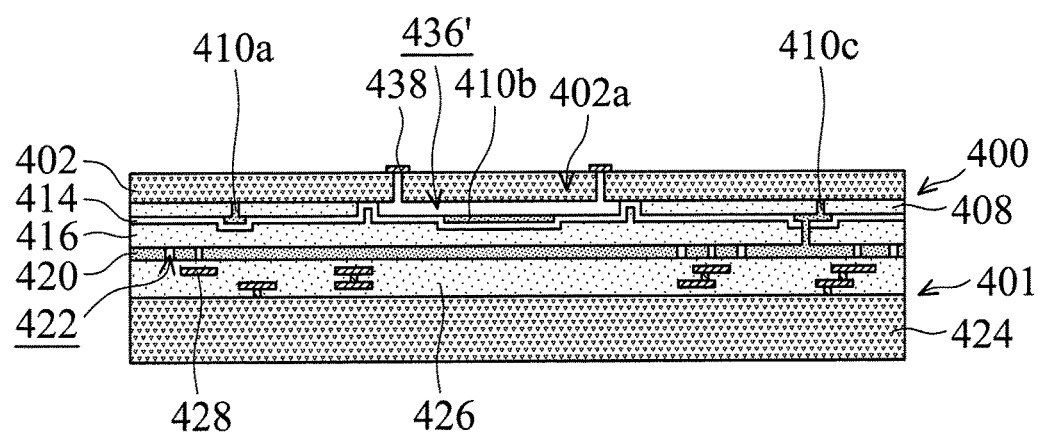

As shown in FIG. 4H, the cavity 436 is vacuumized and sealed by sealing elements 438, in accordance with some embodiments. The material and formation method of the sealing elements 438 may be similar to those of the sealing elements 238. In some embodiments, the structure shown in FIG. 4G is disposed into a deposition tool to deposit the sealing layer. The deposition tool may be a PVD deposition tool, such as a sputtering tool. The structure shown in FIG. 4G is disposed into a process chamber which is vacuumized. After the deposition and patterning of the sealing elements 438 as shown in FIG. 4H, a closed chamber 436' sealed by the sealing elements 438 is formed. The closed chamber 436' surrounds the movable element 402a. The closed chamber 436' may have a pressure in a range from about 10E-7 torr to about 1 torr.

Figure 4I:
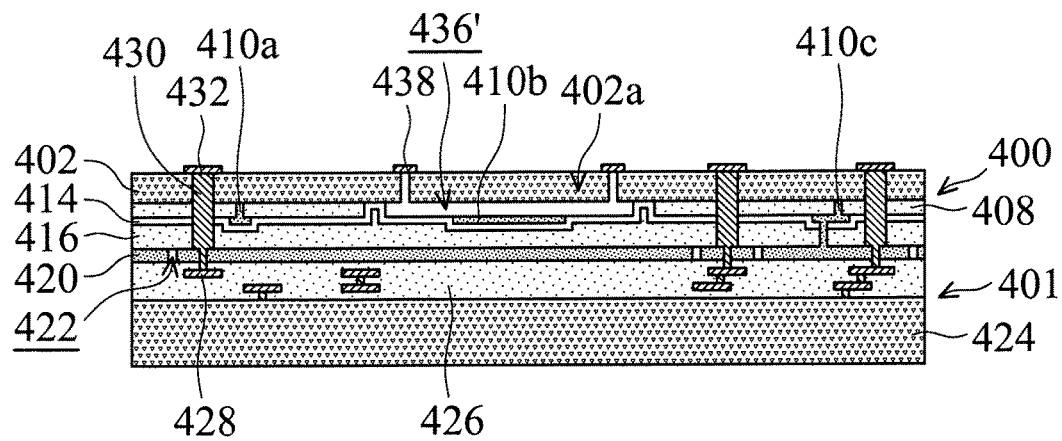

As shown in FIG. 4I, conductive plugs 430 are formed to electrically connect to the conductive pads 428, in accordance with some embodiments. Each of the conductive plugs 430 penetrates through the semiconductor layer 402, the dielectric layer 408, the etch stop layer 414, the dielectric layer 416, one of the recesses 422 formed in the blocking layer 420, and the dielectric layer 426. Therefore, each of the conductive plugs 430 electrically contacts with the corresponding one of the conductive pads 428. In some embodiments, the conductive plugs 430 are in direct contact with the dielectric layers 408 and 416. Each of the conductive plugs 430 may have a wider portion and a thinner portion, which fills one of the recesses 420.

In some embodiments, a photolithography process and multiple etching processes are performed to form a number of via openings. Each of the via openings exposes a corresponding one of the conductive pads 428. For example, a first etching process is performed to partially remove the semiconductor layer 402 from a through hole until the dielectric layer 408 is exposed. Afterwards, a second etching process is performed to partially remove the dielectric layer 408, the etch stop layer 414, and the dielectric layer 416 such that the dielectric layer 426 is exposed through the recess 422. The exposed dielectric layer 426 may further be etched such that the conductive pad 428 is exposed. As a result, the via openings are formed. Since the blocking layer 420 has been patterned to form the recesses 422, no additional etching process for removing the blocking layer 420 is needed. Different etchants may be used in the first and the second etching processes.

After the forming of the via openings, a conductive material may be deposited to fill the via openings to form the conductive plugs 430. In some embodiments, a planarization process, such as a CMP process, is performed to remove the conductive material outside of the via openings. The material and the formation method of the conductive plugs 430 may be similar to those of the conductive plugs 230.

Figure 4J:
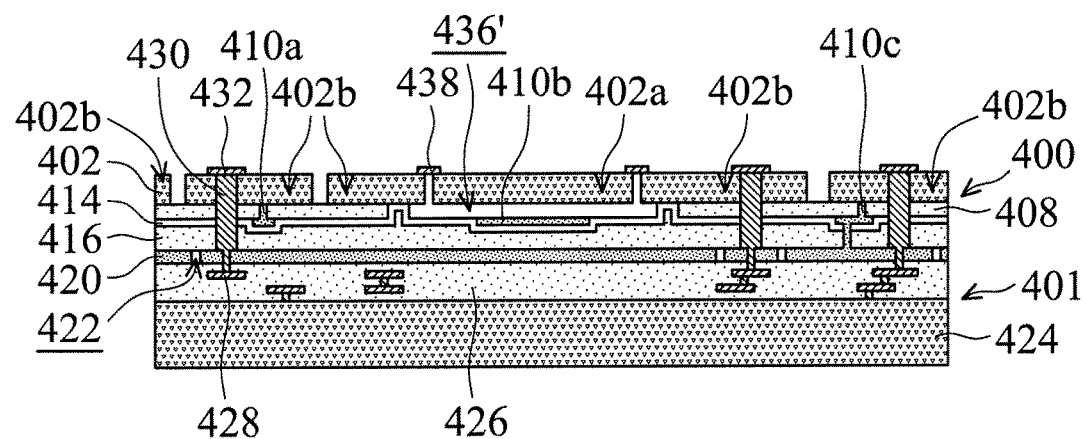

As shown in FIG. 4J, conductive pads 432 are formed over the semiconductor layer 402 to electrically contact with the conductive plugs 430, in accordance with some embodiments. The material and the formation method of the conductive pads 432 may be similar to those of the conductive pads 232.

As shown in FIG. 4J, the semiconductor layer 402 is patterned to form a number of elements including elements 402b, in accordance with some embodiments. Some or all of the elements 402b are electrically isolated from the movable element 402a. Some or all of the elements 402b are electrically isolated from each other. A photolithography process and an etching process may be performed to partially remove the semiconductor layer 402 and pattern the semiconductor layer 402.

Figure 4K:
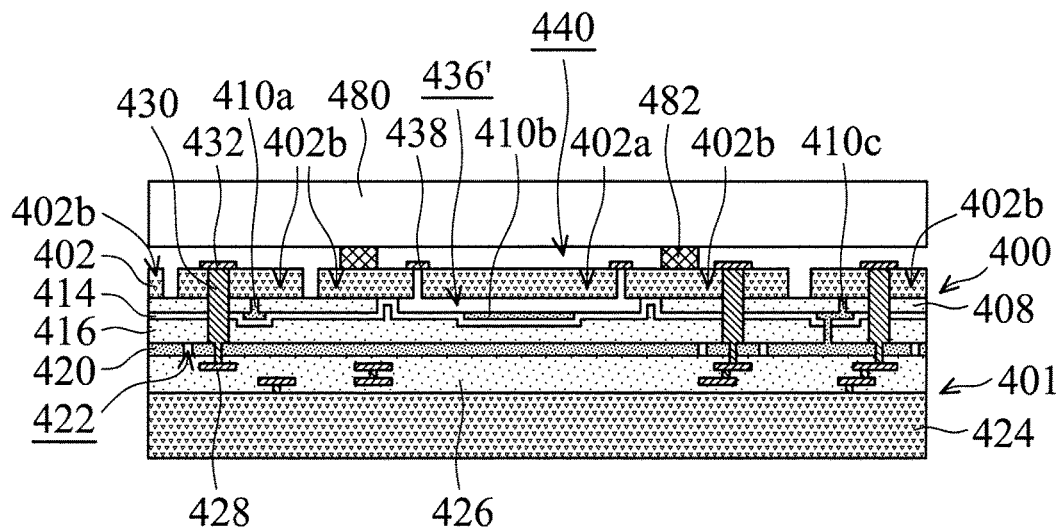

As shown in FIG. 4K, a cap substrate 480 is bonded with the MEMS substrate 400, in accordance with some embodiments. The cap substrate 480 prevents or reduces the particle issues. Suitable bonding techniques may be used to bond the cap substrate 480 and the MEMS substrate 400 together. The suitable bonding techniques may include fusion bonding, eutectic bonding, plasma activated bonding, thermocompression bonding, diffusion bonding, anodic bonding, other applicable bonding, or combinations thereof. In some embodiments, the cap substrate 480 is bonded with the semiconductor layer 402 of the MEMS substrate 400 through one or more bonding structures 482. The bonding structures 482 may be made of a metal material, polymer material, dielectric material, semiconductor material, other applicable materials, or combinations thereof.

After the bonding between the MEMS substrate 400 and the cap substrate 480, a cavity 440 is formed between the semiconductor layer 402 and the cap substrate 480. The cavity 440 is surrounded by the bonding structures 482. In some embodiments, the bonding structures 482 do not completely seal the cavity 440. The cavity 440 is connected to the environment. As a result, the pressure of the environment can be detected. The cavity 440 may have a pressure which is higher than that of the closed chamber 436'. Embodiments of the disclosure have many variations. In some embodiments, the cap substrate 480 and the bonding structures 482 are not formed.

Figure 4L:
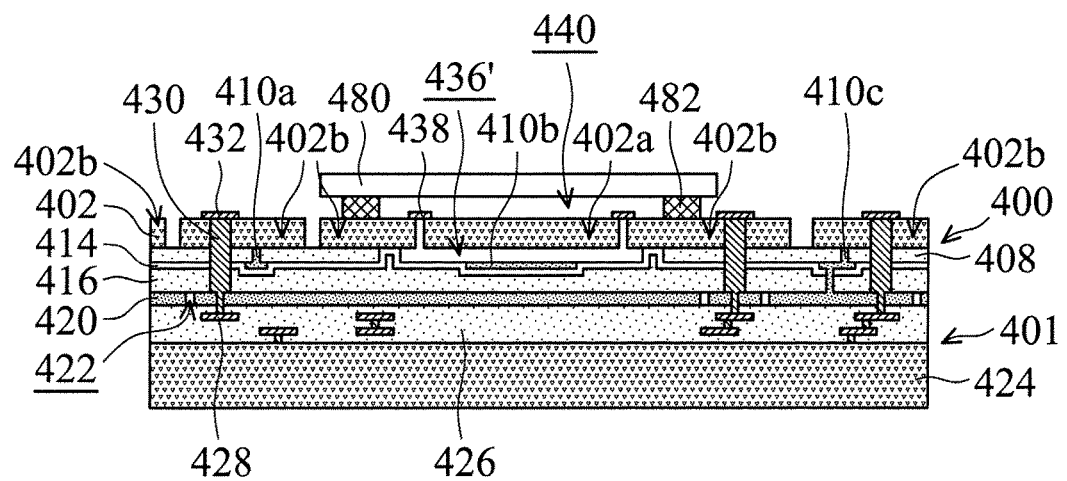

As shown in FIG. 4L, the cap substrate 480 is patterned such that the conductive pads 432 are exposed, in accordance with some embodiments. The cap substrate 480 may be thinned before being patterned. The cap substrate 480 may be patterned by using a dicing saw. The MEMS substrate 400 and the CMOS substrate 401 may also be diced to form multiple MEMS devices separated from each other.

As shown in FIG. 4L, the blocking layer 420 is formed between the closed chamber 436' and the dielectric layer 426 of the CMOS substrate 401. Therefore, any gas coming from the dielectric layer 426 is blocked. The degree of vacuum of the closed chamber 436' is maintained. The dielectric layers 408 and 416 have been annealed at the high temperature. Thus, there is almost no gas, coming from the dielectric layers 408 and 416, would enter the closed chamber 436'. As shown in FIG. 4L, the etch stop layer 414 may also function as a blocking layer to maintain the degree of vacuum of the closed chamber 436'. Since the degree of vacuum is maintained, the sensitivity and performance of the MEMS device are greatly improved.

In some of the embodiments described above, the closed chamber surrounds the movable element of the MEMS substrate and is between the movable element and the dielectric layer of the CMOS substrate. However, embodiments of the disclosure are not limited thereto and have many variations. For example, in some embodiments, the MEMS device includes a motion sensor, such as a gyro device, an accelerometer device, or the like. In these cases, the closed chamber surrounding the movable element is between the CMOS substrate and the cap substrate. The closed chamber contains the movable elements.

Figure 5:
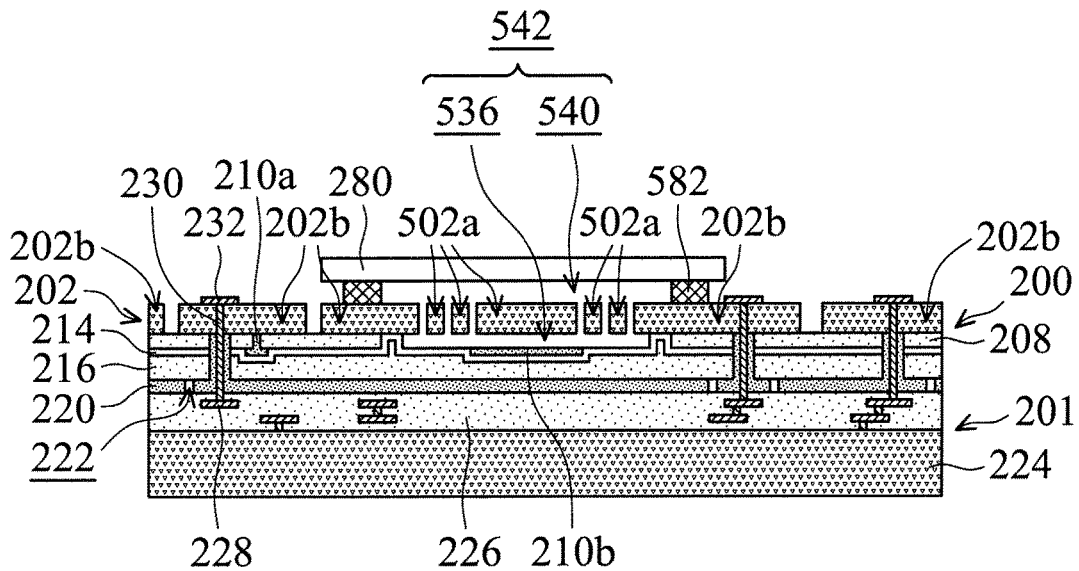
FIG. 5 is a cross-sectional view of a MEMS device, in accordance with some embodiments.

FIG. 5 is a cross-sectional view of a MEMS device, in accordance with some embodiments. Like reference numbers are used to designate like elements. The structure shown in FIG. 5 may be formed by using a process similar to that described in FIGS. 2A-2M.

In some embodiments, a structure similar to that shown in FIG. 2G is provided. Afterwards, a number of release holes are formed and processes similar to those shown in FIGS. 2H-2I are performed. As a result, a portion of the semiconductor layer 202 is patterned to be movable elements 502a, which are released from the dielectric layer 208. A cavity 536 is formed after the movable elements 502a are released.

Afterwards, the cap substrate 280 is bonded over the semiconductor layer 202 through a bonding structure 582 to hermetically seal the movable elements 502a, in accordance with some embodiments. The cap substrate 280 and the bonding structure 582 together surround a space 540 between the cap substrate 280 and the semiconductor layer 202. The bonding structure 582 is a hermetic seal ring forming a closed loop. Therefore, a closed chamber 542, including the cavity 536 and the space 540, is formed between the cap substrate 280 and the dielectric layer 226 of the CMOS substrate 201. The cavity 536 now becomes a portion of the closed chamber 542. The closed chamber 542 surrounds the movable elements 502a. The MEMS device shown in FIG. 5 may be a motion sensor device.

The bonding process of the cap substrate 280 may be performed in a process chamber of a bonding tool. The process chamber has a predetermined pressure. As a result, the closed chamber 542 formed in the process chamber would also have substantially the same pressure. That is, the pressure of the closed chamber 542 is defined by the bonding process of the cap substrate 280. In some embodiments, the pressure of the closed chambers 542 is in a range from about 10E-7 torr to about 760 torr. The pressure of the closed chambers 542 may be adjusted by tuning the pressure of the process chamber. In some embodiments, the MEMS device is used for resonator and gyro applications, and the pressure of the closed chamber 542 is in a range from about 0.01 torr to about 10 torr. In some embodiments, the MEMS device is used for accelerometer application, and the pressure of the closed chamber 542 is in a range from about 50 torr to about 760 torr.

Figure 6:
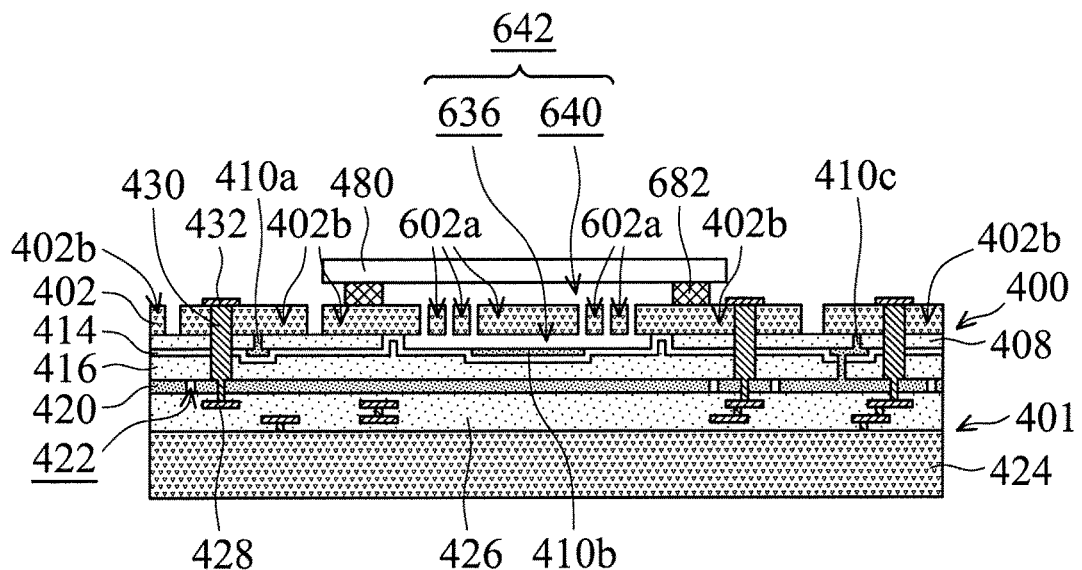
FIG. 6 is a cross-sectional view of a MEMS device, in accordance with some embodiments.

FIG. 6 is a cross-sectional view of a MEMS device, in accordance with some embodiments. Like reference numbers are used to designate like elements. The structure shown in FIG. 6 may be formed by using a process similar to that described in FIGS. 4A-4L.

In some embodiments, a structure similar to that shown in FIG. 4F is provided. Afterwards, a number of release holes are formed and processes similar to those shown in FIGS. 4G-4J are performed without the forming the sealing elements 438. As a result, a portion of the semiconductor layer 402 is patterned to be movable elements 602a, which are released from the dielectric layer 408. A cavity 636 is formed after the movable elements 602a are released.

Afterwards, the cap substrate 480 is bonded over the semiconductor layer 402 through a bonding structure 682 to hermetically seal the movable elements 602a, in accordance with some embodiments. Similarly, a closed chamber 642, including the cavity 636 and a space 640, is formed. The closed chamber 642 surrounds the movable elements 602a. The MEMS device shown in FIG. 6 may be a motion sensor device.

In the embodiments shown in FIGS. 5 and 6, the closed chamber is separated from the dielectric layer of the CMOS substrate by the blocking layer. Therefore, the pressure of the closed chamber and the performance of the MEMS device are maintained.

Embodiments of mechanisms for forming a MEMS device described above form a blocking layer between a closed chamber and dielectric layers of a CMOS substrate. An etch stop layer, such as a low stress nitride layer, could also be used to block gas outside of the closed chamber. Before bonding with the CMOS substrate, a MEMS substrate is annealed at a high temperature to reduce gas coming from dielectric layers of the MEMS substrate. Therefore, the degree of vacuum of the closed chamber is appropriately maintained. The sensitivity and the performance of the MEMS device are significantly improved.

In accordance with some embodiments, a MEMS device is provided. The MEMS device includes a CMOS substrate and a MEMS substrate bonded with the CMOS substrate. The CMOS substrate includes a semiconductor substrate, a first dielectric layer formed over the semiconductor substrate, and a plurality of conductive pads formed in the first dielectric layer. The MEMS substrate includes a semiconductor layer having a movable element and a second dielectric layer formed between the semiconductor layer and the CMOS substrate. The MEMS substrate also includes a closed chamber surrounding the movable element. The MEMS substrate further includes a blocking layer formed between the closed chamber and the first dielectric layer of the CMOS substrate. The blocking layer is configured to block gas, coming from the first dielectric layer, from entering the closed chamber.

In accordance with some embodiments, a MEMS device is provided. The MEMS device includes a semiconductor substrate and a dielectric layer formed over the semiconductor substrate. The MEMS device also includes a MEMS substrate bonded with the dielectric layer. The MEMS substrate includes a semiconductor layer having a sensing element and a closed chamber surrounding the sensing element. The MEMS substrate also includes a blocking layer formed between the closed chamber and the dielectric layer. The blocking layer is configured to block gas, coming from the dielectric layer, from entering the closed chamber.

In accordance with some embodiments, a method for forming a MEMS device is provided. The method includes forming a first dielectric layer over a semiconductor layer, forming a blocking layer over the first dielectric layer, and bonding a CMOS substrate with the blocking layer. The CMOS substrate includes a second dielectric layer, and the blocking layer is configured to block gas coming from the second dielectric layer. The method also includes partially removing the first dielectric layer to form a cavity between the semiconductor layer and the blocking layer. A portion of the semiconductor layer above the cavity becomes a movable element. The method further includes sealing the cavity such that a closed chamber is formed to surround the movable element, and the cavity is a portion of the closed chamber.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for forming a micro-electro mechanical system (MEMS) device, comprising:
   forming a first dielectric layer over a semiconductor layer;
   forming a blocking layer over the first dielectric layer;
   bonding a CMOS substrate with the blocking layer, wherein the CMOS substrate comprises a second dielectric layer, and the blocking layer is configured to block gas coming from the second dielectric layer;
   partially removing the first dielectric layer to form a cavity between the semiconductor layer and the blocking layer, wherein a portion of the semiconductor layer above the cavity becomes a movable element; and
   sealing the cavity such that a closed chamber is formed to surround the movable element, wherein the cavity is a portion of the closed chamber.

2. The method for forming a MEMS device as claimed in claim 1, further comprising vacuumizing the cavity before the sealing of the cavity.

3. The method for forming a MEMS device as claimed in claim 1, further comprising annealing the first dielectric layer to outgas the first dielectric layer before the CMOS substrate is bonded with the blocking layer.

4. The method for forming a MEMS device as claimed in claim 1, further comprising forming an etch stop layer between the first dielectric layer and the blocking layer before the cavity is formed, wherein the etch stop layer surrounds the cavity after the cavity is formed.

5. The method for forming a MEMS device as claimed in claim 1, wherein the forming of the closed chamber comprises bonding a cap substrate over the semiconductor layer through a bonding structure to hermetically seal the movable element and form the closed chamber.

6. The method for forming a MEMS device as claimed in claim 1, further comprising forming at least one opening in the semiconductor layer before the cavity is formed, wherein the first dielectric layer is partially removed through the opening in the semiconductor layer.

7. The method for forming a MEMS device as claimed in claim 1, further comprising forming a via opening penetrating through the first dielectric layer to expose the semiconductor layer, wherein the blocking layer extends into the via opening.

8. The method for forming a MEMS device as claimed in claim 7, wherein the blocking layer fills the via opening.

9. The method for forming a MEMS device as claimed in claim 8, further comprising forming a conductive plug penetrating through a portion of the blocking layer filling the via opening, wherein the conductive plug is electrically connected to a conductive element of the CMOS substrate.

10. The method for forming a MEMS device as claimed in claim 1, further comprising forming a conductive via penetrating through the semiconductor layer, the first dielectric layer, and the blocking layer to be electrically connected to a conductive element formed in the second dielectric layer of the CMOS substrate.

11. A method for forming a micro-electro mechanical system (MEMS) device, comprising:
   forming a first dielectric layer over a semiconductor layer;
   forming an etch stop layer over the first dielectric layer;
   forming a second dielectric layer over the etch stop layer;
   forming a blocking layer over the second dielectric layer;
   bonding a substrate with the blocking layer, wherein the substrate comprises a third dielectric layer, and the blocking layer separates the third dielectric layer from the second dielectric layer;
   partially removing the semiconductor layer and the first dielectric layer to form a cavity between the semiconductor layer and the etch stop layer, wherein a portion of the semiconductor layer above the cavity becomes a movable element; and
   sealing the cavity such that a closed chamber is formed to contain the movable element, wherein the cavity is a portion of the closed chamber.

12. The method for forming a MEMS device as claimed in claim 11, further comprising:
   partially removing the first dielectric layer to form a recess exposing the semiconductor layer before the etch stop layer is formed; and
   forming the etch stop layer over the first dielectric layer such that the etch stop layer extends into the recess.

13. The method for forming a MEMS device as claimed in claim 11, further comprising annealing the first dielectric layer and the second dielectric layer before the substrate is bonded with the blocking layer.

14. The method for forming a MEMS device as claimed in claim 11, further comprising:
   forming an opening penetrating through the second dielectric layer, the etch stop layer, and the first dielectric layer; and
   forming the blocking layer over the second dielectric layer to fill the opening.

15. The method for forming a MEMS device as claimed in claim 14, further comprising forming a conductive structure penetrating through a portion of the blocking layer filling the opening, wherein the conductive structure extends into the third dielectric layer of the substrate.

16. A method for forming a micro-electro mechanical system (MEMS) device, comprising:
forming a first dielectric layer over a first substrate comprising a semiconductor layer;
forming a second dielectric layer over the first dielectric layer;
forming a blocking layer over the second dielectric layer;
bonding a second substrate with the blocking layer;
partially removing the semiconductor layer and the first dielectric layer to form a cavity between the semiconductor layer and the second dielectric layer, wherein a portion of the semiconductor layer becomes a movable element surrounded by the cavity; and
sealing the cavity such that a closed chamber is formed to contain the movable element, wherein the cavity is a portion of the closed chamber.

17. The method for forming a MEMS device as claimed in claim 16, further comprising thinning the first substrate after the second substrate is bonded with the blocking layer and before the cavity is formed.

18. The method for forming a MEMS device as claimed in claim 17, wherein the first substrate comprises the semiconductor layer, an insulating layer, and a semiconductor substrate, and the thinning of the first substrate is achieved by removing the semiconductor substrate and the insulating layer.

19. The method for forming a MEMS device as claimed in claim 17, further comprising:
forming an opening penetrating through the first dielectric layer and the second dielectric layer to expose the semiconductor layer; and
forming the blocking layer over the second dielectric layer to fill the opening.

20. The method for forming a MEMS device as claimed in claim 16, further comprising forming an etch stop layer over the first dielectric layer before the second dielectric layer is formed.

* * * * *